(12) United States Patent
Nugent et al.

(10) Patent No.: US 10,311,357 B2
(45) Date of Patent: Jun. 4, 2019

(54) THERMODYNAMIC-RAM TECHNOLOGY STACK

(71) Applicant: KnowmTech, LLC, Albuquerque, NM (US)

(72) Inventors: Alex Nugent, Santa Fe, NM (US); Timothy Molter, Oberstdorf (DE)

(73) Assignee: KnowmTech, LLC, Santa Fe, NM (US)

( * ) Notice: Subject to any disclaimer, the term of this patent is extended or adjusted under 35 U.S.C. 154(b) by 627 days.

(21) Appl. No.: 14/722,626

(22) Filed: May 27, 2015

(65) Prior Publication Data

US 2016/0148091 A1 May 26, 2016

Related U.S. Application Data

(60) Provisional application No. 62/014,216, filed on Jun. 19, 2014.

(51) Int. Cl.
| | |
|---|---|
| *G06N 3/08* | (2006.01) |
| *G06N 3/04* | (2006.01) |
| *G06N 3/06* | (2006.01) |
| *G06N 3/063* | (2006.01) |
| *G06N 20/00* | (2019.01) |
| *G11C 11/54* | (2006.01) |

(52) U.S. Cl.
CPC .............. *G06N 3/08* (2013.01); *G06N 3/049* (2013.01); *G06N 3/063* (2013.01); *G06N 3/04* (2013.01); *G06N 20/00* (2019.01); *G11C 11/54* (2013.01)

(58) Field of Classification Search
CPC .......... G06N 3/08; G06N 3/049; G06N 3/063; G11C 11/54

USPC .......................................................... 706/25
See application file for complete search history.

(56) References Cited

U.S. PATENT DOCUMENTS

| | | | |
|---|---|---|---|
| 6,889,216 B2 | 5/2005 | Nugent | |
| 6,995,649 B2 | 2/2006 | Nugent | |
| 7,028,017 B2 | 4/2006 | Nugent | |
| 7,039,619 B2 | 5/2006 | Nugent | |
| 7,107,252 B2 | 9/2006 | Nugent | |
| 7,392,230 B2 | 6/2008 | Nugent | |
| 7,398,259 B2 | 7/2008 | Nugent | |
| 7,409,375 B2 | 8/2008 | Nugent | |
| 7,412,428 B2 | 8/2008 | Nugent | |
| 7,420,396 B2 | 9/2008 | Nugent | |
| 7,426,501 B2 | 9/2008 | Nugent | |
| 7,502,769 B2 | 3/2009 | Nugent | |
| 7,599,895 B2 | 10/2009 | Nugent | |
| 7,752,151 B2 | 7/2010 | Nugent | |
| 7,827,130 B2 | 11/2010 | Nugent | |
| 7,827,131 B2 | 11/2010 | Nugent | |
| 7,930,257 B2 | 4/2011 | Nugent | |

(Continued)

*Primary Examiner* — Ly D Pham
(74) *Attorney, Agent, or Firm* — Kermit D. Lopez; Luis M. Ortiz; Ortiz & Lopez, PLLC

(57) ABSTRACT

A thermodynamic RAM technology stack, two or more memristors or pairs of memristors comprising AHaH (Anti-Hebbian and Hebbian) computing components, and one or more AHaH nodes composed of such memristor pairs that form at least a portion of the thermodynamic RAM technology stack. The levels of the thermodynamic-RAM technology stack include the memristor, a Knowm synapse, an AHaH node, a kT-RAM, kT-RAM instruction set, a sparse spike encoding, a kT-RAM emulator, and a SENSE Server.

13 Claims, 6 Drawing Sheets

(56) References Cited

U.S. PATENT DOCUMENTS

| Patent/Publication | Date | Inventor |
|---|---|---|
| 8,022,732 B2 | 9/2011 | Nugent |
| 8,041,653 B2 | 10/2011 | Nugent |
| 8,156,057 B2 | 4/2012 | Nugent |
| 8,311,958 B2 | 11/2012 | Nugent |
| 8,332,339 B2 | 12/2012 | Nugent |
| 8,781,983 B2 | 7/2014 | Nugent |
| 8,909,580 B2 | 12/2014 | Nugent |
| 8,918,353 B2 | 12/2014 | Nugent |
| 8,972,316 B2 | 3/2015 | Nugent |
| 8,983,886 B2 | 3/2015 | Nugent |
| 8,990,136 B2 | 3/2015 | Nugent |
| 9,099,179 B2 | 8/2015 | Nugent |
| 9,104,975 B2 | 8/2015 | Nugent |
| 2003/0177450 A1 | 9/2003 | Nugent |
| 2003/0236760 A1 | 12/2003 | Nugent |
| 2004/0039717 A1 | 2/2004 | Nugent |
| 2004/0153426 A1 | 8/2004 | Nugent |
| 2004/0162796 A1 | 8/2004 | Nugent |
| 2004/0193558 A1 | 9/2004 | Nugent |
| 2005/0015351 A1 | 1/2005 | Nugent |
| 2005/0149464 A1 | 7/2005 | Nugent |
| 2005/0149465 A1 | 7/2005 | Nugent |
| 2005/0151615 A1 | 7/2005 | Nugent |
| 2005/0256816 A1 | 11/2005 | Nugent |
| 2006/0036559 A1 | 2/2006 | Nugent |
| 2006/0184466 A1 | 8/2006 | Nugent |
| 2007/0005532 A1 | 1/2007 | Nugent |
| 2007/0022064 A1 | 1/2007 | Nugent |
| 2007/0176643 A1 | 8/2007 | Nugent |
| 2008/0258773 A1 | 10/2008 | Nugent |
| 2009/0043722 A1 | 2/2009 | Nugent |
| 2009/0138419 A1 | 5/2009 | Nugent |
| 2009/0228415 A1 | 9/2009 | Nugent |
| 2009/0228416 A1 | 9/2009 | Nugent |
| 2010/0280982 A1 | 11/2010 | Nugent |
| 2010/0287124 A1 | 11/2010 | Nugent |
| 2011/0145177 A1 | 6/2011 | Nugent |
| 2011/0145179 A1 | 6/2011 | Nugent |
| 2011/0161268 A1 | 6/2011 | Nugent |
| 2011/0302119 A1 | 12/2011 | Nugent |
| 2012/0078827 A1 | 3/2012 | Nugent |
| 2012/0150780 A1 | 6/2012 | Nugent |
| 2012/0175583 A1 | 7/2012 | Nugent |
| 2012/0191438 A1 | 7/2012 | Nugent |
| 2013/0073493 A1* | 3/2013 | Modha ............... G06N 3/049 706/25 |
| 2013/0073494 A1* | 3/2013 | Modha ............... G06N 3/049 706/25 |
| 2013/0218815 A1 | 8/2013 | Nugent |
| 2013/0258905 A1 | 10/2013 | Nugent |
| 2013/0275358 A1 | 10/2013 | Nugent |
| 2013/0289902 A1 | 10/2013 | Nugent |
| 2014/0006323 A1 | 1/2014 | Nugent |
| 2014/0156576 A1 | 6/2014 | Nugent |
| 2014/0192587 A1 | 7/2014 | Nugent |
| 2015/0019467 A1 | 1/2015 | Nugent |
| 2015/0019468 A1 | 1/2015 | Nugent |
| 2015/0074029 A1 | 3/2015 | Nugent et al. |
| 2015/0286926 A1* | 10/2015 | Nugent ............... G06N 3/049 706/25 |

* cited by examiner

THERMODYNAMIC-RAM TECHNOLOGY STACK

CROSS-REFERENCE TO PROVISIONAL APPLICATION

This patent application claims priority under 35 U.S.C. 119(e) to U.S. Provisional Patent Application Ser. No. 62/014,216, entitled "Thermodynamic-RAM Technology Stack" which was filed on Jun. 19, 2014, the disclosure of which is incorporated herein by reference in its entirety.

STATEMENT OF GOVERNMENT RIGHTS

The United States Government has certain rights in this invention pursuant to Contract No. FA8750-13-C-0031 awarded by the United States Air Force.

TECHNICAL FIELD

Embodiments are generally related to the field of AHaH (Anti-Hebbian and Hebbian) computing. Embodiments also relate to the field of artificial intelligence and machine learning systems, devices, and methods. Embodiments also relate to the field of neuromorphic computing including neuromorphic processors. Embodiments further relate to memristors.

BACKGROUND OF THE INVENTION

Machine learning applications span a very diverse landscape. Some areas include motor control, combinatorial search and optimization, clustering, prediction, anomaly detection, classification, regression, natural language processing, planning, and inference. A common thread is that a system learns the patterns and structure of the data in its environment, builds a model, and uses that model to make predictions of subsequent events and take action.

The models that emerge contain hundreds to trillions of continuously adaptive parameters. Human brains contain on the order of $10^{15}$ adaptive synapses. How the adaptive weights are exactly implemented in an algorithm varies and established methods include support vector machines, decision trees, artificial neural networks, and deep learning to name a few. Intuition tells us learning and modeling the environment is a valid approach in general, as the biological brain also appears to operate in this manner. The unfortunate limitation with our algorithmic approach, however, is that it runs on traditional digital hardware. In such a computer, calculations and memory updates must necessarily be performed in different physical locations, often separated by a significant distance.

The power required to adapt parameters grows impractically large as the number of parameters increases owing to the tremendous energy consumed shuttling digital bits back and forth. In a biological brain (and all of Nature), the processor and memory are the same physical substrate and computations and memory adaptations are performed in parallel. Recent progress has been made with multi-core processors and specialized parallel processing hardware like GP-GPUs, but for machine learning applications that intend to achieve the ultra-low power dissipation of biological nervous systems, it is a dead end approach.

The low-power solution to machine learning occurs when the memory-processor distance goes to zero, and this can only be achieved through intrinsically adaptive hardware.

Given the success of recent advancements in machine learning algorithms combined with the hardware power dilemma, an immense pressure exists for the development neuromorphic computer hardware. The Human Brain Project and the BRAIN Initiative with funding of over EUR 1.190 billion and USD 3 billion respectively partly aim to reverse engineer the brain in order to build brain-like hardware. DARPA's recent SyNAPSE program funded two large American tech companies—IBM Corporation and Hewlett Packard—as well as research giant HRL labs, and aimed to develop a new type of cognitive computer similar to the form and function of a mammalian brain. Cognimem is commercializing a k-nearest neighbor application specific integrated circuit (ASIC), a common machine learning task found in diverse applications. Stanford's Neurogrid, a computer board using mixed digital and analog computation to simulate a network, is yet another approach at neuromorphic hardware. Manchester University's SpiNNaker is another hardware platform utilizing parallel cores to simulate biologically realistic spiking neural networks. IBM Corporation's neurosynaptic core and TrueNorth cognitive computing system resulted from the SyNAPSE program. All these platforms have yet to prove utility along the path towards mass adoption and none have solved the foundational problem of memory-process separation.

More rigorous theoretical frameworks are also being developed for the neuromorphic computing field. For example, the idea of 'universal memcomputing machines' has been proposed as a general-purpose computing machine that has the same computational power as a non-deterministic Universal Turing Machine showing intrinsic parallelization and functional polymorphism. Such a system and other similar proposals employ a relatively new electronic component, the memristor, whose instantaneous state is a function of its past states. In other words, it has memory, and like a biological synapse, it can be used as a subcomponent for computation while at the same time storing a unit of data. A previous study has demonstrated that the memristor can better be used to implement neuromorphic hardware than traditional CMOS electronics.

Our attempt to develop neuromorphic hardware takes a unique approach inspired by life, and more generally, natural self-organization. We call the theoretical result of our efforts 'AHaH Computing'. Rather than trying to reverse engineer the brain or transfer existing machine learning algorithms to new hardware and blindly hope to end up with an elegant power efficient chip, AHaH computing was designed from the beginning with a few key constraints: (1) must result in a hardware solution where memory and computation are combined, (2) must enable most or all machine learning applications, (3) must be simple enough to build chips with existing manufacturing technology and emulated with existing computational platforms, and (4) must be understandable and adoptable by application developers across all manufacturing sectors. This initial motivation led us to utilize physics and biology to create a technological framework for a neuromorphic processor satisfying the above constraints.

In trying to understand how Nature computes, we stumbled upon a fundamental structure found not only in the brain but also almost everywhere one looks—a self-organizing energy-dissipating fractal that we call 'Knowm'. We find it in rivers, trees, lighting, and fungus, but we also find it deep within us. The air that we breathe is coupled to our blood through thousands of bifurcating flow channels that form our lungs. Our brain is coupled to our blood through thousands of bifurcating flow channels that form our arteries and veins. The neurons in our brains are built of thousands of bifurcating flow channels that form our axons and dendrites. At all scales of organization we see the same fractal built from the same simple building block: a simple structure formed of competing energy dissipation pathways. We call this building block Nature's Transistor', as it appears to represent a foundational adaptive building block from which higher-order self-organized structures are built, much like the transistor is a building block for modern computing.

When multiple conduction pathways compete to dissipate energy through an adaptive container, the container will adapt in a particular way that leads to the maximization of energy dissipation. We call this mechanism the Anti-Hebbian and Hebbian (AHaH) plasticity rule. It is computationally universal, but perhaps more importantly and interestingly, it also leads to general-purpose solutions in machine learning.

Because the AHaH rule describes a physical process, we can create efficient and dense analog AHaH synaptic circuits with memristive components. One version of these mixed signal (digital and analog) circuits forms a generic adaptive computing resource we call Thermodynamic Random Access Memory or Thermodynamic-RAM. Thermodynamics is the branch of physics that describes the temporal evolution of matter as it flows from ordered to disordered states, and Nature's Transistor is an energy-dissipation flow structure, hence 'thermodynamic'.

In neural systems, two things specify the algorithm: the network topology and the plasticity of the interconnections or synapses. Any general-purpose neural processor must contend with the problem that hard-wired neural topology will restrict the available neural algorithms that can be run on the processor. It is also crucial that the NPU interface merge easily with modern methods of computing. A 'Random Access Synapse' structure satisfies these constraints.

BRIEF SUMMARY

The following summary is provided to facilitate an understanding of some of the innovative features unique to the disclosed embodiments and is not intended to be a full description. A full appreciation of the various aspects of the embodiments disclosed herein can be gained by taking the entire specification, claims, drawings, and abstract as a whole.

It is, therefore, one aspect of the disclosed embodiments to provide for a thermodynamic RAM (kT-RAM) apparatus.

It is another aspect of the disclosed embodiments to provide for a kT-RAM technology stack.

It is another aspect of the disclosed embodiments to provide a neuromorphic processor and applications thereof based on AHaH (Anti-Hebbian and Hebbian) computing.

It is still another aspect of the disclosed embodiments to provide for a SENSE (Scalable and Extensible Neural Sensing Engine) server implementable in the context of hardware and/or software.

The aforementioned aspects and other objectives and advantages can now be achieved as described herein. A kT-RAM technology stack is disclosed composed of multiple levels of abstraction and specialization needed to implement a neuromorphic processor based on AHaH Computing. A specific implementation is referred to Thermodynamic-RAM (kT-RAM). This brings us closer to brain-like neural computation. kT-RAM can provide a general purpose adaptive hardware resource for existing computing platforms enabling fast and low-power machine learning capabilities that are currently hampered by the separation of memory and processing.

The motivation for defining the technology stack is two-fold. First, explaining kT-RAM is much easier if it is broken down into smaller, more manageable pieces. Secondly, groups interested in realizing kT-RAM can choose a level to contribute to that matches their interest and expertise. The levels of the thermodynamic-RAM technology stack include the memristor, Knowm synapse, AHaH node, kT-RAM, a kT-RAM instruction set, sparse spike encoding, a kT-RAM emulator, and a SENSE Server.

A number of embodiments, preferred and alternative are disclosed herein. For example, in one embodiment, thermodynamic RAM may be implemented, including at least one AHaH circuit and at least one RAM interface. In another embodiment, a digital emulation of such thermodynamic RAM can be provided. In other embodiments, such thermodynamic RAM can be emulated with CPU processors, FPGA processors, GPU processors, Epiphany processors, and custom CMOS circuitry, etc.

In another embodiment, the thermodynamic RAM further includes synapses spike indices of a spike code that can be employed to directly index or activate the synapses of the thermodynamic RAM. In yet another embodiment, multiple thermodynamic RAM can be configured including cores coupled together to emulate a larger thermodynamic RAM core.

In still another embodiment, a thermodynamic RAM application server (e.g., a SENSE server) can be implemented which include collection modules comprising, for example, at least one machine learning module that executes thermodynamic RAM instruction set calls; at least one spoke encoding algorithm; at least one spoke pattern buffer; and at least one spike stream joiner. In some embodiments, the thermodynamic RAM application server can run via, for example, a Linux operating system. In another embodiment, the thermodynamic RAM can be integrated with a CPU such that a thermodynamic RAM instruction set is specified as a part of a CPU instruction set. The thermodynamic RAM can be integrated with the CPU via, for example, a north bridge, a south bridge, a PCI bus, and/or an LPR bus.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

Figure 1:
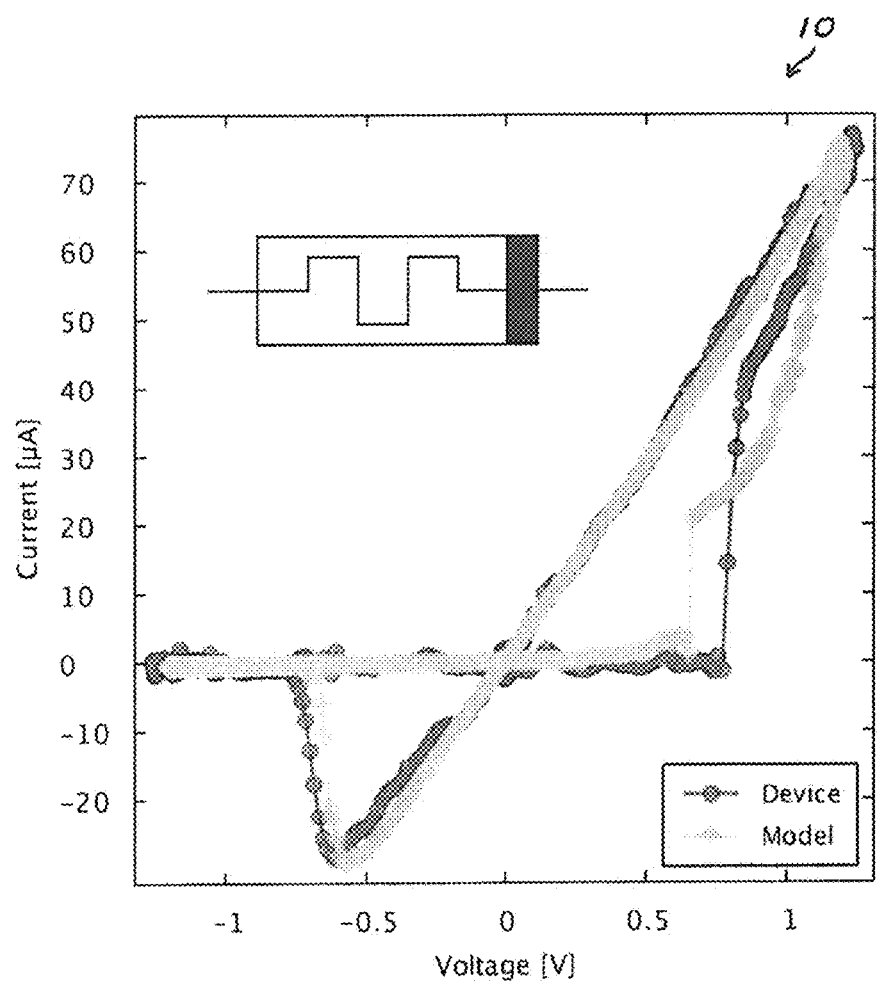
FIG. 1 illustrates a hysteresis plot for a Ag-chalcogenide device, in accordance with an embodiment.

The particular values and configurations discussed in these non-limiting examples can be varied and are cited merely to illustrate at least one embodiment and are not intended to limit the scope thereof.

Thermodynamic-RAM is the first attempt of realizing a working neuromorphic processor implementing the theory of AHaH Computing. While several alternative designs are feasible and may offer specific advantages over others, the first design aims to be a general computing substrate geared towards reconfigurable network topologies and the entire spectrum of the machine learning application space.

As discussed herein, the entire design specification can be broken down into various levels from ideal memristors to integrating a finished product into existing technology. Defining the individual levels of this 'technology stack' helps to introduce the technology step by step and group the necessary pieces into tasks with focused objectives. This allows for separate groups to specialize at one or more levels of the stack where their strengths and interests exist. Improvements at various levels can propagate throughout the whole technology ecosystem, from materials to markets, without any single participant having to bridge the whole stack. In a way, the technology stack is an industry specification.

Many memristive materials have recently been reported and the trend continues. New designs and materials are being used to create a diverse range of devices and gaps in the existing spectrum are being filled. Memristor models are also being developed and incrementally improved upon. Our generalized metastable switch (MSS) memristor is to date the most accurate configuration shown to capture the behavior of memristors at a level of abstraction sufficient to enable efficient circuit simulations while simultaneously describing as wide a range of devices as possible. An MSS is an idealized two-state element that switches probabilistically between its two states as a function of applied voltage bias and temperature. A memristor is modeled by a collection of MSSs evolving in time, which captures the memory-enabling hysteresis behavior. The MSS model can be made more complex to account for failure modes, for example, by making the MSS state potentials temporally variable. Multiple MSS models with different state potentials can be combined in parallel or series to model increasingly more complex state systems.

In our semi-empirical model, the total current through the device comes from both a memory-dependent (MSS) current component, $I_m$, and a Schottky diode current, $I_s$ in parallel as indicated by equation (1) below:

$$I = \phi I_m(V,t) + (1-\phi) I_s(V) \tag{1}$$

where $\phi \in [0,1]$. A value of $\phi=1$ represents a device that contains no Schottky diode effects. The Schottky diode effect accounts for the exponential behavior found in many devices and allows for the accurate modeling of that effect, which the MSS component cannot capture alone. Thermodynamic-RAM is not constrained to just one particular memristive device; any memristive device can be used as long as it meets the following criteria: (1) it is incremental and (2) its state change is voltage dependent. Based on our current understanding, the ideal device would have low thresholds of adaptation (<0.2 V), on-state resistance of approximately 10 kΩ or greater, high dynamic range, durability, the capability of incremental operation with very short pulse widths and long retention times of a week or more. However, even devices that deviate considerably from these parameters will be useful in more specific applications. For example, short retention times on the order of seconds are perfectly compatible with combinatorial optimizers.

We have previously shown that our generalized MSS model for memristors accurately models four potential memristor candidates for Thermodynamic-RAM, and we have incorporated the model into our circuit simulation and machine learning benchmarking software. (e.g., see M. A. Nugent and M. T. W, "Ahah computing-from metastable switches to attractors to machine learning," PLoS ONE, vol. 9, p. e85175, 02 2014, which is incorporated herein by reference).

A recent Ag-chalgogenide memristor from Boise State University device and model hysteresis plot 10 is depicted in FIG. 1. Such a model can provide a common ground from which a diversity of devices can be compared and incorporated into the technology stack. By modeling a device with the MSS model, a material scientist can evaluate its utility across real-world benchmarks via software emulators and gain valuable insight into what memristive properties are, and are not, useful in the application space.

Figure 2:
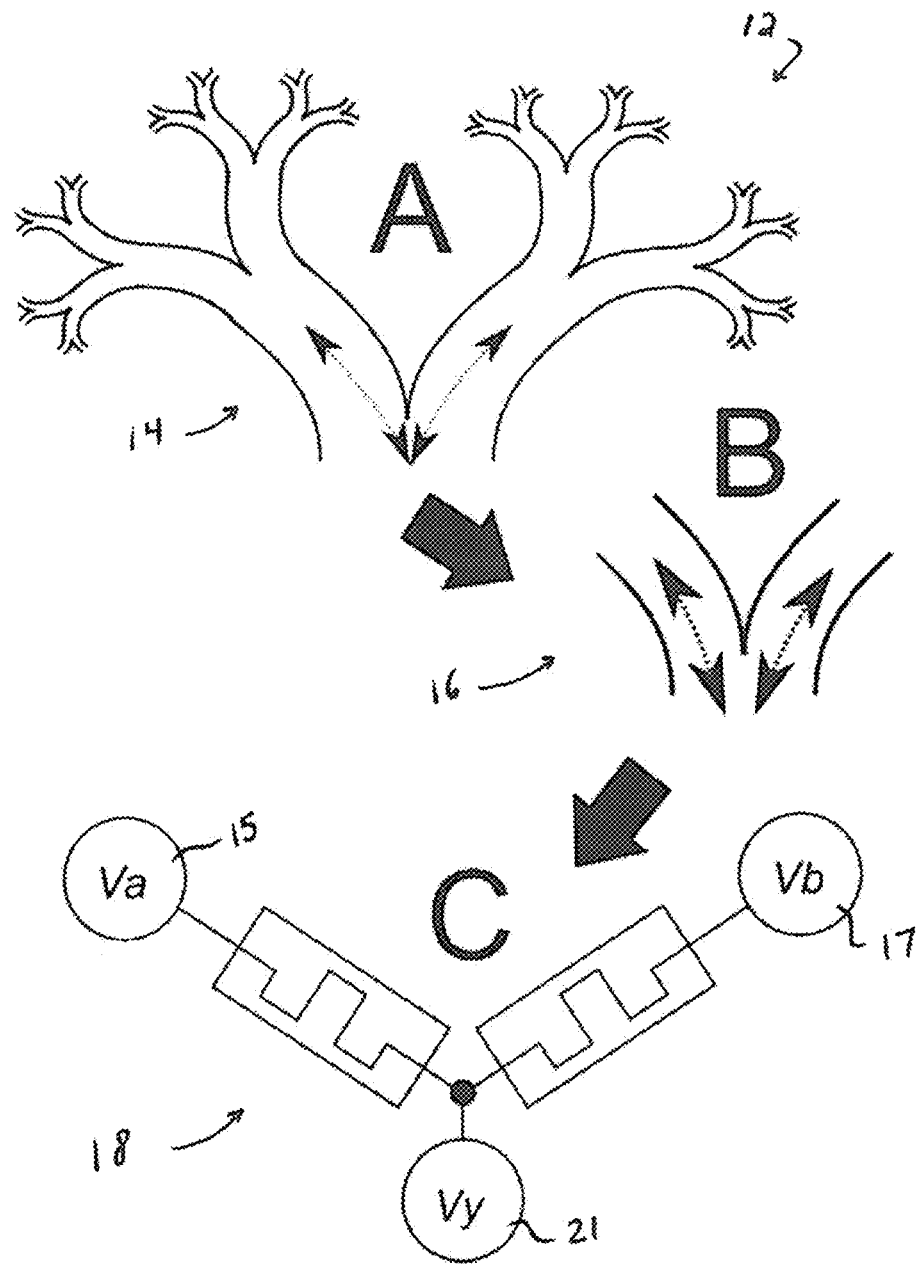
FIG. 2 illustrates a self-organizing energy-dissipating fractal system including at least a Knowm synapse, a differential pair of memristors, and a means for implementing a Knowm synapse in electronics, in accordance with an embodiment.

FIG. 2 illustrates a self-organizing energy-dissipating fractal system 12 including at least a Knowm synapse, a differential pair of memristors, and a means for implementing a Knowm synapse in electronics, in accordance with an embodiment. A self-organizing energy-dissipating fractal can be referred to as "Knowm", as shown at Part A or section 14 in FIG. 2, and can be composed of a simple repeating structure formed of competing energy dissipation pathways. This building block can be referred to as a "Knowm synapse" and is represented by Part B or section 16 in FIG. 2. A differential pair of memristors, as shown at Part C or memristors 18 of FIG. 2, provides a means for implementing a Knowm synapse in electronics. A Knowm synapse can thus be thought of as "Nature's transistor." Memristors 18 include three voltage points 15, 17, 21, respectively, Va, Vb, Vy.

A memristor is an adaptive energy-dissipating pathway. As current flows through it, its internal state changes and heat is exchanged to the surrounding environment. When two adaptive energy-dissipating pathways compete for conduction resources, a Knowm synapse ("nature's transistor") will emerge. Two competing memristors thus form a Knowm synapse as shown in FIG. 2.

We see this building block for self-organized structures throughout Nature, for example, in arteries, veins, lungs, neurons, leaves, branches, roots, lightning, rivers, and mycelium networks of fungus. We observe that in all cases there is a particle that flows through competitive energy dissipating assemblies. The particle is either directly a carrier of free energy dissipation or else it appears to gate access, like a key to a lock, to free energy dissipation of the units in the collective. Some examples of these particles include water in plants, ATP in cells, blood in bodies, neurotrophins in brains, and money in economies. In the cases of whirlpools, hurricanes, tornadoes, and convection currents we note that although the final structure does not appear to be built of competitive structures, it is the result of a competitive process with one winner; namely, the spin or rotation.

The circuits capable of achieving AHaH plasticity can be broadly categorized by the electrode configuration that forms the Knowm synapse as well as how the input activation (current) is converted to a feedback voltage that drives unsupervised anti-Hebbian learning. Examples of such circuits are disclosed in U.S. Pat. No. 7,599,895 entitled "Methodology for the configuration and repair of unreliable switching elements," which issued on Oct. 6, 2009, and is incorporated herein by reference. Other examples of such circuits are disclosed in U.S. Pat. No. 7,420,396 entitled "Universal logic gate utilizing nanotechnology," which issued on Sep. 2, 2008 and is incorporated herein by reference. U.S. Pat. Nos. 7,599,895 and 7,420,396 are assigned to KnowmTech, LLC.

Synaptic currents can be converted to a feedback voltage statically (resistors or memristors), dynamically (capacitors), or actively (operational amplifiers). Each configuration requires unique circuitry to drive the electrodes so as to achieve AHaH plasticity, and multiple driving methods exist. Both polar and non-polar memristors can be used, the later requiring long periods of decay following periods of learning to prevent device saturation. The result is that a very large number of AHaH circuits exist. Herein, a '2-1' two-phase circuit configuration with polar memristors is introduced because of its compactness and because it is amenable to simple mathematical analysis.

Figure 3:
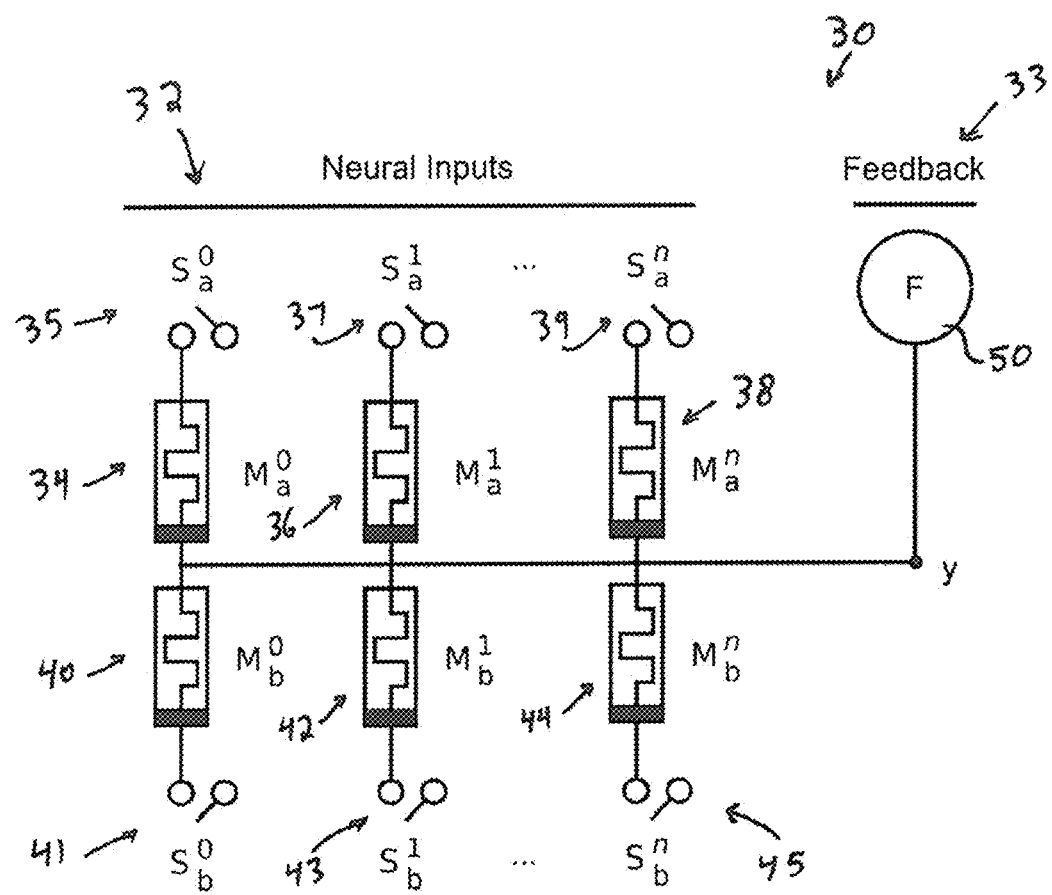
FIG. 3 illustrates a system composed of a 2-1 AHaH Node circuit configured from n Knowm synapses sharing a common output electrode, y, in accordance with an embodiment.

FIG. 3 illustrates a system 30 composed of an AHaH node configured from n Knowm synapses sharing a common output electrode, y, in accordance with an embodiment. System 30 includes neural inputs 32 and a feedback portion 33. The neural inputs are composed of memristors 34, 36, 38 respectively associated with switches 35, 37, 39 and memristors 40, 42, 44 respectively associated with switches 41, 43, 45. The memristors 34, 36, 38 and 40, 42, 44 are connected to feedback 50. Although not shown in FIG. 3, it can be appreciated that additional switches may be used to isolate each synapse from the output electrode.

FIG. 3 thus demonstrates that an AHaH node can be made up of n Knowm synapses sharing a common output electrode, y. The Knowm synapse and the AHaH node are analogous to a biological synapse and neuron, respectively. In Thermodynamic-RAM, the number of input synapses can be configured via software and several AHaH nodes can be connected together to form any desired network topology by a technique referred to as temporal partitioning.

An AHaH Node can be formed when a collective of Knowm synapses are coupled to a common readout line. Through spike encoding and temporal multiplexing, an AHaH node is capable of being partitioned into smaller functional AHaH nodes. An AHaH node provides a simple but computationally universal (and extremely useful) adaptation resource. The functional objective of the AHaH node shown in FIG. 3 is to produce an analog output on electrode y, given an arbitrary spike input of length N with k active inputs and N-k inactive (floating) inputs.

The circuit or system 30 shown in FIG. 3 includes one or more memristor pairs 34, 40; 36, 42 and 38, 44 (i.e., Knowm synapses) sharing a common electrode labeled y (i.e., connected to feedback 33). Switches gating access to a driving voltage are labeled with an S, referring to 'spike'. The individual switches for spike inputs of the AHaH Node are labeled $S^0, S^1, \ldots S^n$. The driving voltage source for supervised and unsupervised learning is labeled F. The subscript values a and b indicate the positive and negative dissipative pathways, respectively.

During the read phase, switches $S_a$ and $S_b$ are set to +V and -V respectively for all k active inputs. Inactive S inputs are left floating. The combined conductance of the active inputs produces an output voltage on electrode y. This analog signal contains useful confidence information and can be digitized via the sgn( ) function to either a logical 1 or a 0, if desired.

During the write phase, voltage source F is set to either $V_y^{write}=\overline{Vsgn}(V_y^{read})$ (unsupervised) or $V_y^{write}=\overline{Vsgn}(s)$ (supervised), where s is an externally applied teaching signal. The polarity of the driving voltage sources gates by the switches S is inverted to -V and +V. The polarity switch causes all active memristors to be driven to a less conductive state, counteracting the read phase. If this dynamic counteraction did not take place, the memristors would quickly saturate into their maximally conductive states, rendering the synapses useless.

A more intuitive explanation of the above feedback cycle is that "the winning pathway is rewarded by not getting decayed." Each synapse can be thought of as two competing energy dissipating pathways (positive or negative evaluations) that are building structure (differential conductance). We may apply reinforcing Hebbian feedback by (1) allowing the winning pathway to dissipate more energy or (2) forcing the decay of the losing pathway. If we chose method (1), then we must at some future time ensure that we decay the conductance before device saturation is reached. If we chose method (2) then we achieve both decay and reinforcement at the same time. Method (2) is faster while method (1) is more energy efficient. The lowest energy solution is to use natural decay rather than forced decay, but this introduces complexities associated with matching the decay rate to the particular processing task.

Figure 4:
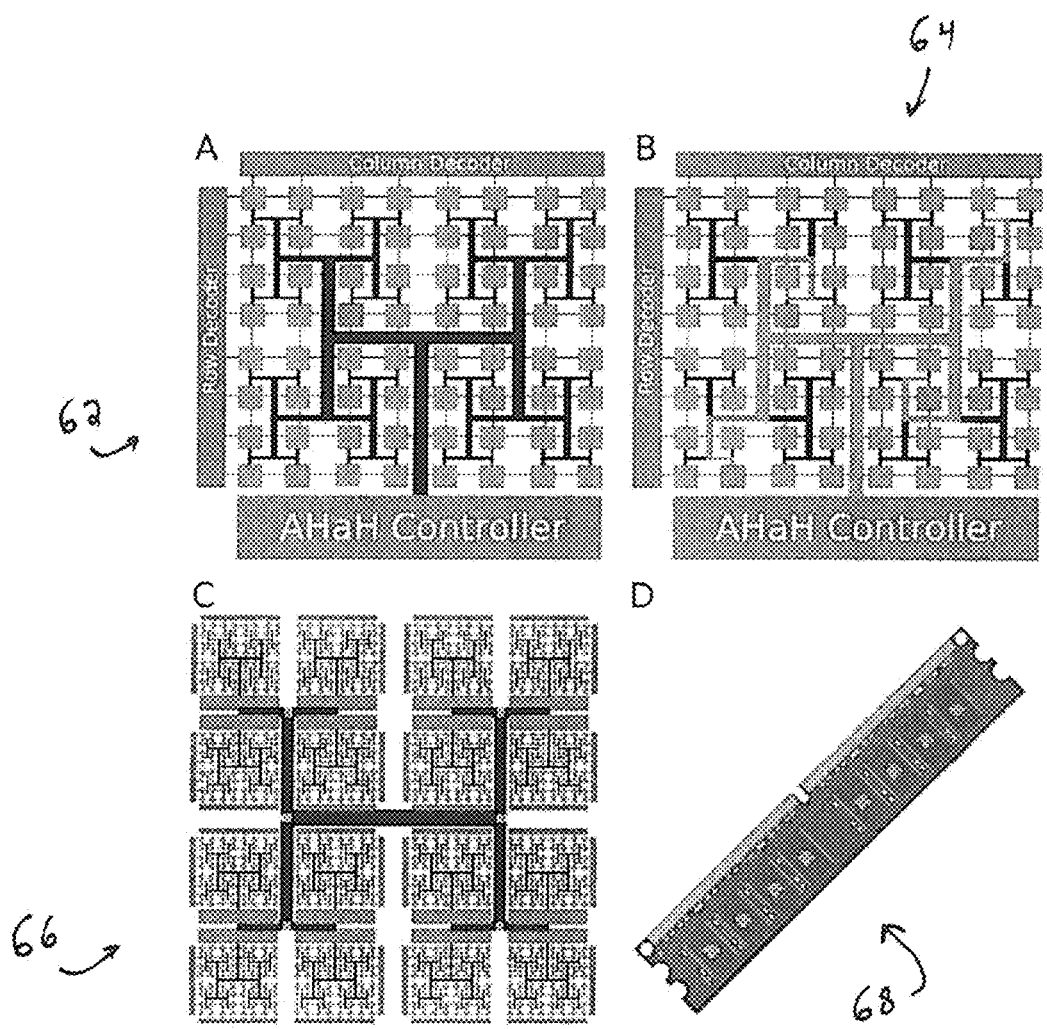
FIG. 4 illustrates an AHaH Circuit superimposed on top of a RAM core with synaptic inputs turned on in the same addressable manner in which bits are set in RAM, in accordance with a preferred embodiment.

FIG. 4 illustrates an AHaH circuit 62 superimposed on top of a normal RAM core with synaptic inputs turned on in the same addressable manner in which bits are set in RAM, in accordance with a preferred embodiment. FIG. 4 also indicates via circuit 64 that during the read and write phases, the activated synapses are accessed in parallel and their individual states are concurrently adapted. Then, as shown at circuit 66 by coupling several cores together, a very large kT-RAM can be created for tasks such as inference or to increase parallel execution, kT-RAM module(s) 68 can borrow from existing RAM architecture to be easily integrated into existing digital computing platforms.

As previously indicated, the particular design of kT-RAM presented in this paper prioritizes flexibility and general utility above anything else, much in the same way that a CPU is designed for general-purpose use. This particular design builds upon commodity RAM using its form factor and the row and column address space mapping to specific bit cells. Modifying RAM to create a kT-RAM core requires the following steps: (1) removal of the RAM reading circuitry, (2) minor design modifications of the RAM cells, (3) the addition of memristive synapses to the RAM cells, (4) addition of H-Tree circuitry connecting the synapses, and (5) addition of driving and output sensing circuitry—the 'AHaH Controller'. Multiple kT-RAM cores can be manufactured and connected to each other on the same die (see circuit 66). Leveraging existing techniques and experience of foundries capable of producing commodity RAM as well as using three to five generation-old processing facilities will make the prototyping and manufacturing of kT-RAM relatively inexpensive. Even the final packaging of kT-RAM modules (see kT-RAM module(s) 68) can leverage existing commodity hardware infrastructure.

Circuits 62, 64 indicate what kT-RAM would look like with its H-Tree sensing node connecting all the underlying synapses located at each cell in the RAM array. The fractal binary tree shown is the AHaH Node's output electrode, y, as shown in FIG. 3. While at first glance it appears like this architecture leads to one giant AHaH Node per chip or core, the core can be partitioned into smaller AHaH nodes of arbitrary size by temporally partitioning sub portions of the tree. In other words, so long as it is guaranteed that synapses assigned to a particular AHaH node partition are never co-activated with other partitions, these 'virtual' AHaH nodes can co-exist on the same physical core. This allows us to effectively exploit the extreme speed of modern electronics. Any desired network topology linking AHaH nodes together can be achieved easily through a kT-RAM/CPU/RAM paring.

Software enforces the constraints, while the hardware remains flexible. Through temporal partitioning combined with spike encoding, AHaH nodes can be allocated with as few as one or as many synapses as the application requires and can be connected to create any network topology. This flexibility is possible because of a RAM interface with addressable rows and columns. Crossbar architectures, in addition to sneak-path issues, introduce a restrictive topology. While this is good for specialized applications, one cannot build a general-purpose machine learning substrate from an intrinsically restricted topology. Cores can be electrically coupled to form a larger combined core. The number of cores, and the way in which they are addressed and accessed, will vary across implementations so as to be optimized for end use applications. AHaH node sizes can therefore vary from one synapse to the size of the kT-RAM chip, while digital coupling could extend the maximal size to the 'cloud', limited only by the cores intrinsic adaptation rates and chip-to-chip communication.

Thermodynamic RAM performs an analog sum of currents and adapts physically, eliminating the need to compute and write memory updates. One can theoretically exploit the kT-RAM instruction set (see Table 1 below) however they wish. However, to prevent weight saturation, one must pair 'forward' instructions with 'reverse' instructions. For example, a forward-read operation FF should be followed by a reverse operation (RF, RH, RL, RZ, RA or RU) and vice versa. The only way to extract state information is to leave the feedback voltage floating, and thus there are two possible read instructions: FF and RF. There is no such thing as a 'non-destructive read' operation in kT-RAM. Every memory access results in weight adaptation according to AHaH plasticity. By understanding how the AHaH rule works (AHaH Computing), we can exploit the weight adaptations to create, among other things, 'self-healing hardware'. The act of accessing the information actually repairs and heals it.

TABLE I kT-RAM Instruction Set

| Instruction | Synapse Driving Voltage | Feedback Voltage (F) |
|---|---|---|
| FF | Forward-Float | None/Floating |
| FH | Forward-High | −V |
| FL | Forward-Low | +V |
| FU | Forward-Unsupervised | −V if y ≥ 0 else +V |
| FA | Forward-Anti-Unsupervised | +V if y ≥ 0 else −V |
| FZ | Forward-Zero | 0 |
| RF | Reverse-Float | None/Floating |
| RH | Reverse-High | −V |
| RL | Reverse-Low | +V |
| RU | Reverse-Unsupervised | −V if y ≥ 0 else +V |
| RA | Reverse-Anti-Unsupervised | +V if y ≥ 0 else −V |
| RZ | Reverse-Zero | 0 |

A spike stream is the means in which real-world data is asynchronously fed into kT-RAM. Its biological counterpart would be the bundles of axons of the nervous system, which carry sensed information from sensing organs to and around the cortex. A sparse spike stream interface is the only option with kT-RAM, and it is used for all machine learning applications from robotic control to clustering to classification. This trait enables an application developer to leverage their knowledge and experience using kT-RAM in one domain and transfer it over to another.

Spikes can directly address core synapses. The synaptic core address can thus be given by the sum of the AHaH node's core partition index and the spike ID, which are both just integers in the spike space. Spikes enable kT-Core partitioning and multiplexing, which in turn enables arbitrary AHaH node sizes and hence very flexible network topologies. Sparse spike encoding is also very energy and bandwidth efficient and has shown to produce state-of-the-art results on numerous benchmarks. We choose spikes because they work, and we are attempting to engineer a useful computing substrate. The fact that the spike encoding appears to match biology is of course curious, but ultimately not important to our objectives.

A collection of N synapses belongs to a neuron (AHaH Node), each with an associated weight: $\{w_0, w_1, \ldots w_n\}$. A subset of the synapses in an AHaH node can be activated by some input spike pattern, and the total neural activation is the voltage of the H-Tree, which can be read out on the common electrode, y by the AHaH controller. For many input patterns, x is a sparse spiking representation, meaning that only a small subset of the spike channels are activated out of the spike space, and when they are, they are of value 1. So for a neuron with 16 inputs, one possible sparse-spike pattern would look like: x={1000010000000000}. Since two of the 16 possible inputs are active (spiking), we say that it has a sparsity of 2/16 or 12.5%. Since most of the inputs are zero, we can write this spike pattern in a much more efficient way by just listing the index of the inputs that are spiking: x={0,6}.

Figure 5:
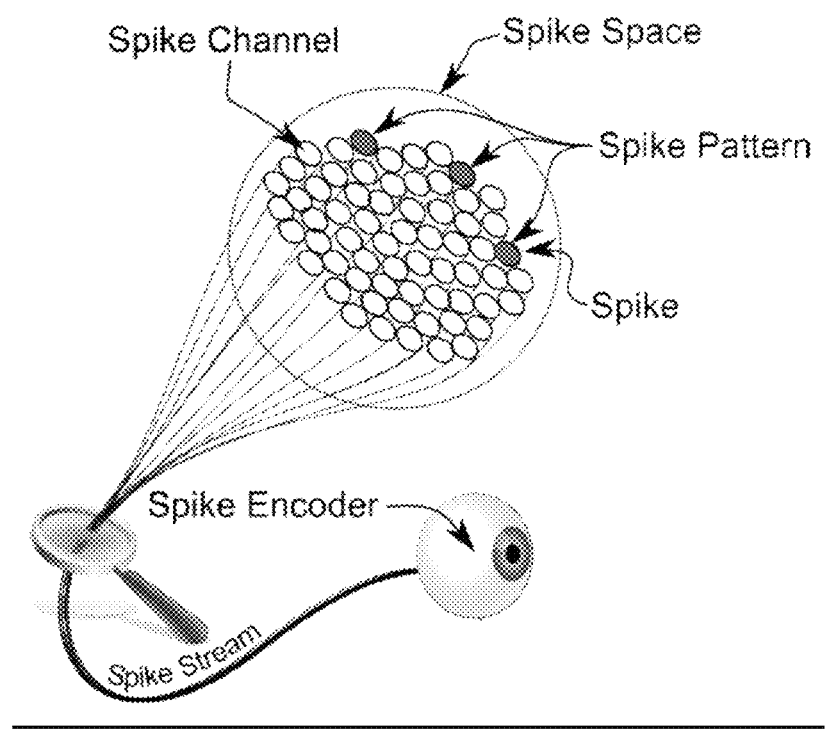
FIG. 5 illustrates the concept of spike encoding in accordance with an embodiment.

We call x a 'spike set' or 'spike pattern' or sometimes just 'spikes'. The 'spike space' is the total number of 'spike channels', in this case 16. In some problems such as inference or text classification, the spike space can get all the way up to 250,000 or more. A good way to picture it is as a big bundle of wires, where the total number of wires is the spike space and the set of wires active at any given time is the spike pattern. We call this bundle of wires and the information contained in it the 'spike stream'. The algorithms or hardware that converts data into a sparse-spiking representation are called 'spike encoders'. Your eyes, ears, and nose are examples of spike encoders. A visual representation of this can be seen in the spike-based system 70 shown in FIG. 5. The example spike-based system 70 (e.g., kT-RAM) requires Spike Encoders (sensors), Spike Streams (wire bundles), Spike Channels (a wire), Spike Space (Number of Wires), Spike Sets or Patterns (active spike channels), and finally Spikes (the state of being active). A spike encoding is, surprisingly, nothing more than a digital code.

Thermodynamic-RAM is designed to plug into existing computing architectures easily. The envisioned hardware format is congruent with standard RAM chips and RAM modules and would plug into a motherboard in a variety of different ways. In general, there are two main categories of integration. First, kT-RAM can be tightly coupled with the CPU, on the CPU die itself or connected via the north bridge. In this case, the instruction set of the CPU would have to be modified to accommodate the new capabilities of kT-RAM. Secondly, kT-RAM is loosely coupled as a peripheral device either via the PCI bus, the LPC bus, or via cables or ports to the south bridge. In these cases, no modification to the CPU's instruction set would be necessary, as the interfacing would be implemented over the generic plug in points over the south bus. As in the case with other peripheral devices, a device driver would need to be developed. Additional integration configurations are also possible.

Given the envisioned hardware integration, kT-RAM simply becomes an additional resource that software developers have access to via an API. In the meantime, kT-RAM is implemented as an emulator running on von Neumann architecture, but the API will remain the same. Later, when the new NPU is available, it will replace the emulator, and existing programs will not need to be rewritten to benefit from the accelerated capabilities offered by the hardware. In any case, kT-RAM operates asynchronously. As new spike streams arrive, the driver in control of kT-RAM is responsible for activating the correct synapses and providing the AHaH controller with an instruction pair for each AHaH node. The returned activation value can then be passed back to the program and used as needed.

Emulators allow developers to commence application development while remaining competitive with competing machine learning approaches. In other words, we can build a market for kT-RAM across all existing computing platforms while we simultaneously build the next generation of kT-RAM hardware. kT-RAM software emulators for both memristive circuit validation and near-term application development on digital computers have already been developed and deployed commercially on real-world client problems. Our current digital kT-Core emulators have proven to be extremely efficient running on commodity hardware, matching and in many cases exceeding existing methods in benchmarks of solution performance, energy and memory efficiency. Thermodynamic-RAM is not a 'ten year technology' nor is it 'bleeding edge'. Rather, it is already solving real-world machine learning problems on existing digital platforms.

Figure 6:
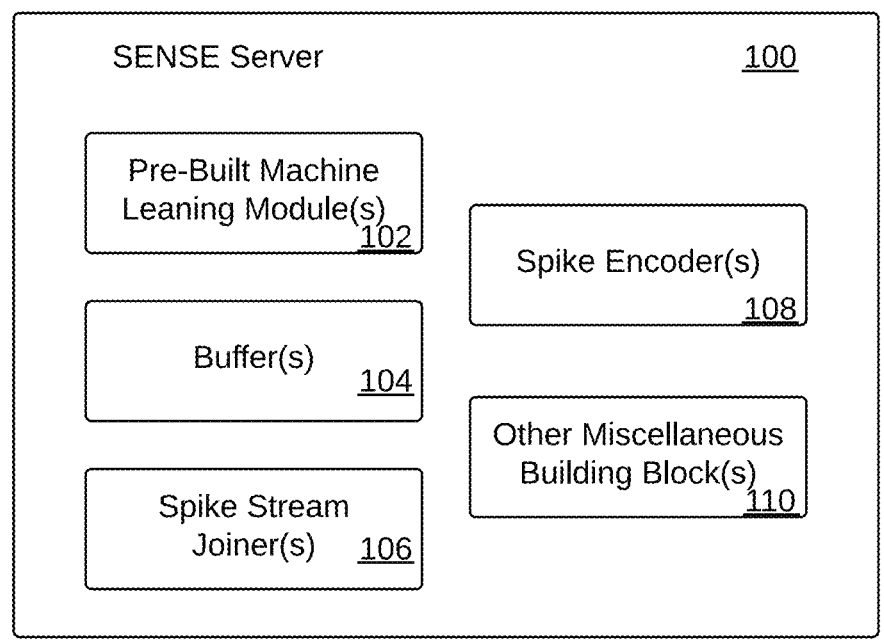
FIG. 6 illustrates a block diagram of a SENSE (Scalable and Extensible Neural Sensing Engine) server, which can be implemented in accordance with an alternative embodiment.

FIG. 6 illustrates a block diagram of a SENSE (Scalable and Extensible Neural Sensing Engine) server 100, which can be implemented in accordance with a preferred embodiment. While a machine learning application developer using the kT-RAM emulator would have full control of the design of the application and can use kT-RAM to its full potential, she would be required to understand the instruction set and underlying mechanics of kT-RAM and AHaH computing. This level of development is analogous to writing assembly code or using a very low-level programming library. To assist in the rapid development of applications based on kT-RAM, we have developed a top-level server-based application framework for application development. We call it 'Scalable and Extensible Neural Sensing Engine' or 'SENSE Server' for short. An example of such a SENSE server 100 is thus shown in FIG. 6.

The SENSE server 100 contains higher-level pre-built machine learning module(s) 102, standard spike encoder(s) 108, buffer(s) 104, spike stream joiner(s) 106, and other miscellaneous building blocks 110, which can be configured by the developer for a unique machine learning application. The SENSE server 100 can be implemented in the context of "plug-and-play" machine learning apps (i.e., applications). This level of development is analogous to an SQL server like MySQL, where one can provide a configuration file to specify its behavior. Like the MySQL server, the SENSE server 100 can run as a daemon service, waiting for asynchronous interactions from the outside world. In the case of the SENSE server 100, however, the SENSE server 100 waits for incoming spikes flowing in over the configured spike streams. To install and run the SENSE server 100 on Linux, one would run a command in a terminal such as, for example, 'sudo apt-get install knowm-sense' followed by 'start knowmsense myconfig.yml', where 'myconfig.yml' would be the custom configuration file defining the 'netlist' and parameter settings of the particular machine learning application. The SENSE server 100 can be run on commodity computer hardware, robotic platforms, or mobile devices with a Linux or *nixbased operating system. The SENSE server 100 can also be ported over to additional platforms such as iOS, Android, and Windows.

Based on the foregoing, it can be appreciated that a thermodynamic-RAM and a technology stack, a specification or blueprint, for a future industry enabled by AHaH computing are disclosed herein. kT-RAM is a particular design that prioritizes flexibility and general utility above anything else, much in the same way that a CPU is designed for general purpose use. The flexibility offered by this design allows for a single architecture that can be used for the entire range of machine learning applications given their unique network topologies. Much like the cortex integrates signals from different sensing organs via a common 'protocol', the sparse spike encoding interface of kT-RAM allows for a well-defined way to integrate environmental data asynchronously. Conveniently, the sparse spike-encoding interface is a perfect bridge between digital systems and neuromorphic hardware.

Just as modern computing is based on the concept of the bit and quantum computing is based on the concept of the qubit, AHaH computing is built from the ahbit. AHaH attractor states are a reflection of the underlying statistics (history) of the applied data stream. It is both the collection of physical synapses and also the structure of the information that is being processed that together result in an AHaH attractor state. Hence, an ahbit is what results when we couple information to energy dissipation. Our kT-RAM design borrows heavily from commodity RAM using its form factor to build upon and leverage today's chip manufacturing resources. The RAM module packaging and concise instruction set will allow for easy integration into existing computing platforms such as commodity personal computers, smartphones, and super computers. Our kT-RAM emulator allows us to develop applications, demonstrate utility, and justify a large investment into future chip development.

When chips are available, existing applications using the emulator API will not have to be rewritten in order to take advantage of new hardware acceleration capabilities. The topmost level of the kT-RAM technology stack is the SENSE Server, a framework for configuring a custom machine learning application based on a 'netlist' of pre-built machine learning modules, standard spike encoders, buffers, spike stream joiners, and other miscellaneous building blocks.

At the core of the adaptive power problem is the energy wasted during memory processor communication. The ultimate solution to the problem entails finding ways to let memory configure itself and AHaH computing is a conceptual framework for understanding how this can be accomplished. Thermodynamic-RAM is an adaptive physical hardware resource for providing AHaH plasticity and hence a substrate from which AHaH computing is possible. In previous work, we have shown demonstrations of universal logic, clustering, classification, prediction, robotic actuation and combinatorial optimization benchmarks using AHaH computing, and we have successfully mapped all these functions to the kT-RAM instruction set and emulator. Efficient emulation has already been demonstrated on commodity von Neumann hardware, and a path ahead towards neuromorphic chips has been defined. Along the way, the emulator will be ported to coprocessors like GP-GPUs, FPGAs, and Epiphany™ chips to further improve speed and power efficiency with available hardware. Progress is being made independently at various levels, but a coordinated and focused effort by multiple participants is needed to bridge the full technology stack.

Some embodiments can be implemented in the context of, for example, a module or one or more modules. Although not required, embodiments can be configured or operated in the general context of computer-executable instructions, such as program modules, being executed by a single computer. In most instances, a "module" constitutes a software application. However, a module may also be composed of, for example, electronic and/or computer hardware or such hardware in combination with software. In some cases, a "module" can also constitute a database and/or electronic hardware and software that interact with the database. In some instances, a "module" as discussed herein may constitute hardware components such as computer circuitry.

Generally, program modules include, but are not limited to, routines, subroutines, software applications, programs, objects, components, data structures, etc., that perform particular tasks or implement particular abstract data types and instructions. Moreover, those skilled in the art will appreciate that the disclosed method and system may be practiced with other computer system configurations, such as, for example, hand-held devices, multi-processor systems, data networks, microprocessor-based or programmable consumer electronics, networked PCs, minicomputers, mainframe computers, servers, and the like.

Note that the term module as utilized herein may refer to a collection of routines and data structures that perform a particular task or implements a particular abstract data type. Modules may be composed of two parts: an interface, which lists the constants, data types, variable, and routines that can be accessed by other modules or routines; and an implementation, which is typically private (accessible only to that module) and which includes source code that actually implements the routines in the module. The term module may also simply refer to an application, such as a computer program designed to assist in the performance of a specific task, such as, for example, emulation of an AHaH node or nodes, thermodynamic RAM, and so on. In some cases, a module may constitute physical thermodynamic RAM (i.e., hardware, IC chips, or components of an IC chip, etc.).

Based on the foregoing, it can be appreciated that a number of embodiments, preferred and alternative are disclosed herein. For example, in one embodiment, thermodynamic RAM may be implemented, including at least one AHaH circuit and at least one RAM interface. In another embodiment, a digital emulation of such thermodynamic RAM can be provided. In other embodiments, such thermodynamic RAM can be emulated with CPU processors, FPGA processors, GPU processors, Epiphany processors, and custom CMOS circuitry, etc.

In another embodiment, the thermodynamic RAM further includes synapses spike indices of a spike code that can be employed to directly index or activate the synapses of the thermodynamic RAM. In yet another embodiment, multiple thermodynamic RAM can be configured including cores coupled together to emulate a larger thermodynamic RAM core.

In still another embodiment, a thermodynamic RAM application server (e.g.; a SENSE server) can be implemented which includes collection modules comprising, for example, at least one machine learning module that executes thermodynamic RAM instruction set calls; at least one spoke encoding algorithm; at least one spoke pattern buffer; and at least one spike stream joiner. In some embodiments, the thermodynamic RAM application server can run via, for example, a Linux operating system. In another embodiment, the thermodynamic RAM can be integrated with a CPU such that a thermodynamic RAM instruction set is specified as a part of a CPU instruction set. The thermodynamic RAM can be integrated with the CPU via, for example, a north bridge, a south bridge, a PCI bus, and/or an LPR bus.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

The invention claimed is:

1. Thermodynamic RAM (Random Access Memory), comprising:
   an AHaH (Anti-Hebbian and Hebbian) circuit comprising synaptic inputs and at least one MSS (Metastable Switch) memristor, wherein said AHaH circuit is superimposed above at least one RAM core having bits, such that said synaptic inputs of said AHaH circuit are turned on in the same order in which said bits are set in said at least one RAM core; and
   a plurality of memristive synapses comprising said synaptic inputs, said plurality of memristive synapses configured from said at least one MSS memristor, wherein said thermodynamic RAM performs an analog sum of currents based on an instruction set and said plurality of memristive synapses adapt physically by weight adaptation according to AHaH plasticity, which eliminates a need to compute and write memory updates, and wherein forward and reverse instructions thereof are paired to prevent weight saturation.

2. The thermodynamic RAM of claim 1 further comprising a digital emulation of said thermodynamic RAM.

3. The thermodynamic RAM of claim 2 wherein said thermodynamic RAM is emulated with CPU (Central Processing Unit) processors.

4. The thermodynamic RAM of claim 2 wherein said thermodynamic RAM is emulated with FPGA (Field Programmable Gate Array) processors.

5. The thermodynamic RAM of claim 2 wherein said thermodynamic RAM is emulated with GPU (Graphics Processing Unit) processors.

6. The thermodynamic RAM of claim 2 wherein said thermodynamic RAM is emulated with Epiphany processors.

7. The thermodynamic RAM of claim 2 wherein said thermodynamic RAM is emulated with custom CMOS circuitry.

8. The thermodynamic RAM of claim 1 wherein spike indices of a spike code are employed to directly index or activate said memristive synapses of said thermodynamic RAM.

9. The thermodynamic RAM of claim 1 further comprising multiple thermodynamic RAM including a plurality of thermodynamic RAM cores electrically coupled together to emulate a larger thermodynamic RAM core.

10. The thermodynamic RAM of claim 2 wherein spike indices of a spike code are employed to directly index or activate said memristive synapses of said thermodynamic RAM.

11. The thermodynamic RAM of claim 2 further comprising multiple thermodynamic RAM including a plurality of thermodynamic RAM cores electrically coupled together to emulate a larger thermodynamic RAM core.

12. The thermodynamic RAM of claim 7 wherein spike indices of a spike code are employed to directly index or activate said memristive synapses of said thermodynamic RAM.

13. The thermodynamic RAM of claim 7 further comprising multiple thermodynamic RAM including a plurality of thermodynamic RAM cores electrically coupled together to emulate a larger thermodynamic RAM core.

* * * * *